(12) United States Patent
Mahawili

(10) Patent No.: US 6,965,092 B2
(45) Date of Patent: Nov. 15, 2005

(54) ULTRA FAST RAPID THERMAL PROCESSING CHAMBER AND METHOD OF USE

(75) Inventor: Imad Mahawili, Grand Rapids, MI (US)

(73) Assignee: Hitachi Kokusai Electric, Inc. (JP)

( * ) Notice: Subject to any disclaimer, the term of this patent is extended or adjusted under 35 U.S.C. 154(b) by 190 days.

(21) Appl. No.: 10/074,287

(22) Filed: Feb. 12, 2002

(65) Prior Publication Data

US 2002/0111043 A1 Aug. 15, 2002

Related U.S. Application Data

(60) Provisional application No. 60/268,340, filed on Feb. 12, 2001.

(51) Int. Cl.[7] .................................................. F27B 5/14
(52) U.S. Cl. ....................... 219/390; 219/405; 219/411; 219/686; 219/121.6; 219/121.85; 392/416; 392/418; 118/724; 118/725; 118/50.1; 439/799; 439/772; 438/486; 438/149; 156/583.2
(58) Field of Search ................................. 219/390, 405, 219/411, 686, 762, 121.6, 121.85, 121.81; 118/724, 725, 501; 392/416, 418; 439/799, 530, 772; 438/486–487, 149–151, 308, 166, 9, 14; 156/583.2

(56) References Cited

U.S. PATENT DOCUMENTS

| | | | |
|---|---|---|---|
| 3,836,751 A | 9/1974 | Anderson | 219/411 |
| 4,550,684 A | 11/1985 | Mahawili | 118/724 |
| 4,558,660 A | 12/1985 | Nishizawa et al. | 118/725 |
| 4,592,307 A | 6/1986 | Jolly | 118/719 |
| 4,649,261 A | 3/1987 | Sheets | 219/390 |
| 4,680,447 A | 7/1987 | Mahawili | 219/343 |
| 4,680,451 A | 7/1987 | Gat et al. | 219/411 |
| 4,748,135 A | 5/1988 | Frijlink | 437/102 |
| 4,834,022 A | 5/1989 | Mahawili | 118/725 |
| 4,993,358 A | 2/1991 | Mahawili | 118/715 |
| 5,155,336 A | 10/1992 | Gronet et al. | 219/411 |
| 5,219,786 A * | 6/1993 | Noguchi | 438/5 |
| 5,317,492 A | 5/1994 | Gronet et al. | 362/294 |
| 5,366,002 A | 11/1994 | Tepman | 165/1 |
| 5,446,825 A | 8/1995 | Moslehi et al. | 392/416 |
| 5,453,124 A | 9/1995 | Moslehi et al. | 118/715 |
| 5,487,127 A | 1/1996 | Gronet et al. | 392/416 |
| 5,525,160 A | 6/1996 | Tanaka et al. | 118/728 |
| 5,551,985 A | 9/1996 | Brors et al. | 118/725 |
| 5,566,744 A | 10/1996 | Tepman | 165/80.1 |
| 5,603,772 A | 2/1997 | Ide | 118/724 |
| 5,814,365 A * | 9/1998 | Mahawili | 427/10 |
| 5,951,896 A * | 9/1999 | Mahawili | 219/411 |
| 6,156,030 A * | 12/2000 | Neev | 606/10 |
| RE37,546 E | 2/2002 | Mahawili | 427/10 |
| 6,645,838 B1 * | 11/2003 | Talwar et al. | 438/530 |

* cited by examiner

Primary Examiner—Shawntina Fuqua
(74) Attorney, Agent, or Firm—Van Dyke, Gardner, Linn & Burkhart, LLP

(57) ABSTRACT

An apparatus and method and processing a semiconductor substrate that controls heating of the substrate to thereby control the depth of the junctions formed by impurities implanted in the semiconductor substrate by heating a device side of the semiconductor substrate to a reference temperature and heating the device side of the semiconductor substrate to a heat activation temperature that is greater than the reference temperature for an activation period, which provides sufficient energy to activate the impurities so that they become part of the lattice structure of the substrate while minimizing diffusion of the impurities across the substrate and reducing the temperature gradient in the substrate to minimize stress in the substrate.

3 Claims, 4 Drawing Sheets

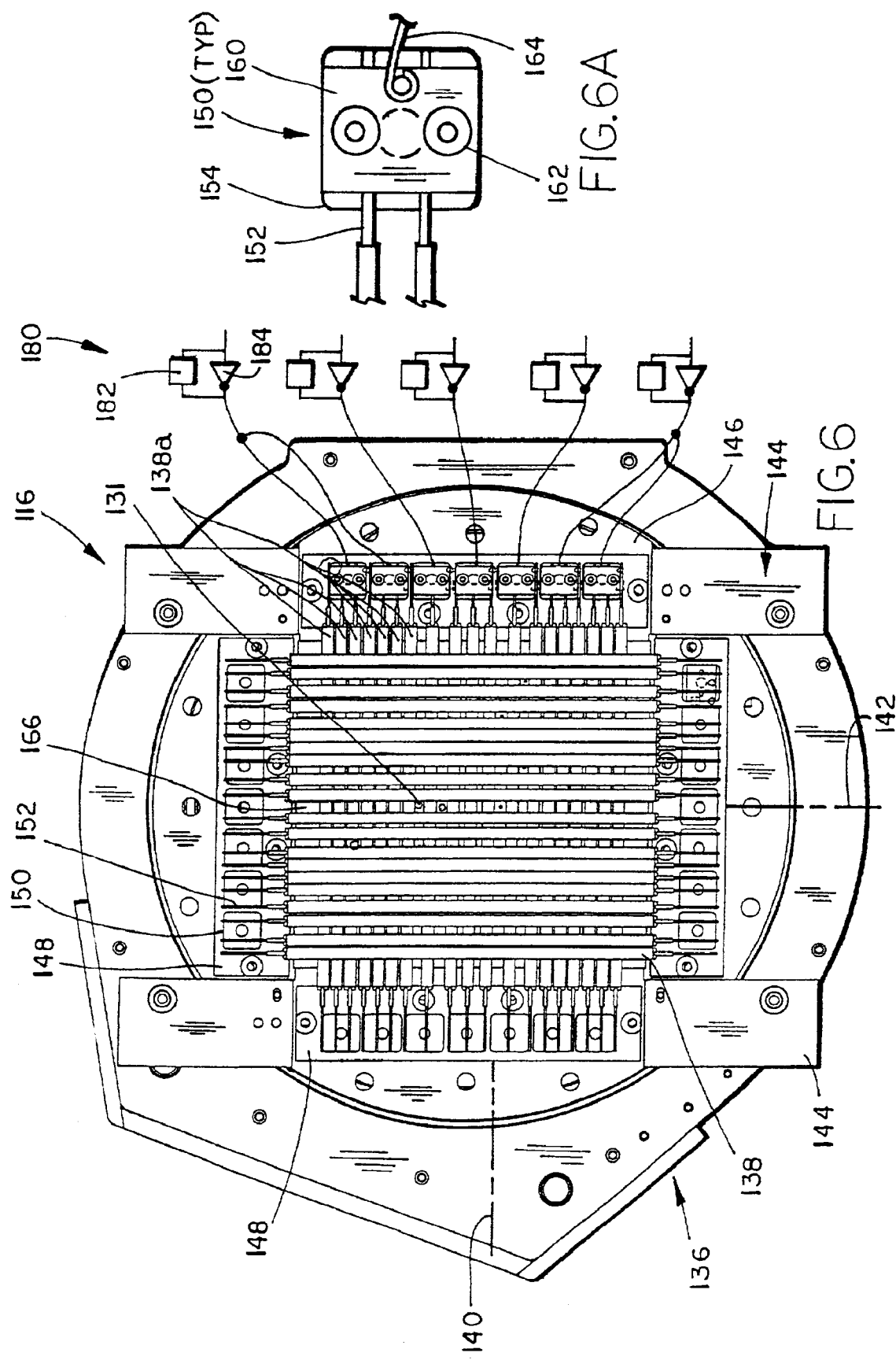

ULTRA FAST RAPID THERMAL PROCESSING CHAMBER AND METHOD OF USE

The present application claims priority from provisional application entitled ULTRA FAST RAPID THERMAL PROCESSING CHAMBER AND METHOD OF USE, Ser. No. 60/268,340, filed Feb. 12, 2001, which is incorporated herein by reference.

TECHNICAL FIELD AND BACKGROUND OF THE INVENTION

The present invention relates to a semiconductor processing apparatus and method for the thermal processing of thin film applications on a semiconductor substrate, such as a semiconductor wafer, in which the temperature of the substrate can be accurately controlled to minimize the diffusion of the impurities in the substrate to achieve junctions that produce higher speed devices than heretofore known.

In electronic device fabrication, gases containing impurities, such as arsenic, phosphorous, boron, or the like, are injected onto a semiconductor substrate, such as a polysilicon wafer, to implant impurities in the substrate. In order to activate the impurities so that they become part of the lattice structure of the substrate, and therefore form the junctions that create electronic devices, the semiconductor substrate is typically heated to relatively high temperatures.

The heat that is required to achieve activation of the reactant gas impurities with the lattice structure of the semiconductor substrate, such as a polysilicon wafer, and to form junctions in the substrate, also contributes to diffusion of the impurities through the substrate. With increased diffusion, the electrical performance of the devices is significantly degraded.

One solution is to localize the temperature on the device side of the substrate to control diffusion. However, at these elevated processing temperatures, localized heating generates extremely large vertical temperature gradients though the substrate. These vertical temperature gradients produce thermal moments in the substrate, which cause defects that detrimentally effect current leakage in the devices.

Consequently, there is a need for a processing reactor and method of high temperature processing of a semiconductor substrate that can deliver heat to the substrate in manner to achieve thinner junctions and, therefore, create faster devices, while maintaining the vertical thermal stresses in the substrate at acceptable levels.

SUMMARY OF THE INVENTION

Accordingly, the present invention provides an apparatus and method of processing a semiconductor substrate that controls the heating of the substrate to thereby control the depth of the junctions formed by impurities implanted in the semiconductor substrate.

In one form of the invention, a semiconductor substrate, which is implanted with impurities, is heated on its non-device side to a reference temperature, and heated on its device side to an activation temperature greater than the reference temperature for an activation period, which provides sufficient energy to activate the impurities so that they become part of the lattice structure of the substrate while minimizing diffusion of the impurities across the substrate and reducing the temperature gradient in the substrate to minimize the stress in the substrate.

In one aspect, the device side of substrate is pulsed with an activation heat to heat the device side to its activation temperature. For example, the device side of the substrate may be pulsed with a source of high energy, such as radiation having a wavelength in a range of about 0.3 microns to 0.9 microns or in a range of about 0.3 microns to 0.7 microns. For example, the device side of the substrate may be heated using a light source, such as a xenon lamp, including a water-cooled xenon lamp, or a tungsten halogen lamp, including a water-cooled tungsten halogen lamp. In addition, the duration of the pulse may vary from few microseconds up to one to two seconds, but more typically in a range of a few hundred milliseconds.

In another aspect, the energy of the high-energy pulse is greater than the substrate band gap. For example, for a silicon wafer, the wavelength of the high-energy pulse is greater than about 1.2 electron volts (eV).

In other aspects, a heater for the device side of the substrate includes a filter, which filters out energy having a wavelength greater than 0.9 microns or greater than about 0.7 microns so that the energy of the device-side heater is greater than the band gap of the substrate.

In another aspect, the substrate is rotated during heating. For example, the substrate may be rotated at a rotational speed of in a range of about 50 revolutions per minute to about 300 revolutions per minute and typically about 180 revolutions per minute According to another form of the invention, the temperature of a semiconductor substrate, which is implanted with impurities, is biased to reference temperature. The top surface of the device side of the substrate is heated to an activation temperature greater than the reference temperature for an activation period, which provides sufficient energy to activate the impurities so that they become part of the lattice structure of the substrate while minimizing diffusion of the impurities through the substrate and reducing the temperature gradient in the substrate to minimize the stress in the substrate.

In one aspect, the top surface of the device side is heated to a depth in a range of about 1 micron to 2 microns. In other aspects, the non-device side of the substrate is heated by one or more lamps generating a peak energy over a wavelength in a range of about 0.9 microns to 2.3 microns. For example, a suitable lamp includes a tungsten halogen lamp. The top surface of the device side is heated by one or more lamps having a wavelength in a range of about 0.3 microns to 0.9 microns or in a range of about 0.3 microns to 0.7 microns. For example, the top surface of device side of the substrate may be heated with one or more xenon lamps, including water-cooled xenon lamps.

In other aspects, the heater for the top surface of the device side includes a filter, which filters out energy having a wavelength greater than 0.9 microns or a wavelength of greater than 0.7.

According to yet another form of the invention, a method of heating a semiconductor substrate, which is implanted with impurities, includes heating a non-device of the substrate to a reference temperature with a non-device-side heater having a wavelength in a range of about 0.9 microns to 2.3 microns, and heating a device side of the substrate to a heat-activation temperature greater than the reference temperature with a device-side heater having a wavelength in a range of about 0.3 microns to 0.9 microns, whereby the impurities are sufficiently activated to become part of the lattice of the substrate.

In one aspect, the device-side heater heats the device side of the substrate with pulse heating. For example, the duration of the pulse may be in a range of a few hundred milliseconds to one or two seconds.

In another aspect, the device-side heater heats the device of the substrate to a temperature of greater than 900° C. In a further aspect, the device-side heater heats the device of the substrate to a temperature of greater than 1000° C., for example, in a period of about a few hundred milliseconds to one or two seconds. In yet a further aspect, the device-side heater heats the device of the substrate to a temperature of about 1100° C., in a period of about a few hundred milliseconds to one or two seconds.

In further aspects, the non-device-side heater heats the non-device side of the substrate to a temperature in a range of about 400° C. to 900° C., or in a range of about 500° C. to 600° C. In addition, at least the non-device side is heated uniformly, for example, with a radial temperature uniformity of about +/−1° C.

According to yet another form of the invention, a reactor includes a processing chamber, a first heater which is adapted to heat a device side of the substrate, and a second heater which is adapted to heat the non-device side of the substrate. The first heater generates energy at a wavelength in a range of about 0.3 microns to 0.9 microns, while the second heater generates energy at a wavelength in a range of about 0.9 microns to 2.3 microns.

In one aspect, the reactor is adapted to rotatably support the semiconductor substrate and, further, to rotate the substrate during heating whereby the substrate is uniformly heated. For example, the substrate may be supported on a rotational platform that rotates the substrate in a range of about 5 rpm to 60 rpm or in a range of up to 200 rpm to 300 rpm.

In another aspect, the first heater heats the device side of the substrate with pulse heating. For example, the first heater heats at a pulse in a range of a few hundred milliseconds to one or two seconds. Where the substrate is supported on a rotational platform that rotates the substrate in a range of about 5 rpm to 60 rpm, the first heater heats the device side with multiple pulses.

According to yet another form of the invention, a semiconductor processing chamber includes a housing, which defines a processing chamber that is adapted to support a semiconductor substrate therein, and means for applying a first energy to a non-device side of the semiconductor substrate and for applying a pulse energy to a device side of the semiconductor substrate wherein the intensity of the first energy is less than the pulse energy and the duration of the pulse energy is less than the first energy to control the depth of the junctions formed by impurities implanted in the semiconductor substrate and control the diffusion of the impurities through the substrate.

In one aspect, the pulse energy has a duration in a range of about 1 microsecond to 2 seconds. More preferably, the pulse energy has a duration in a range of about 100 milliseconds to 400 milliseconds.

In other aspects, the means for applying includes a first energy source and a second energy source. The first energy source applies the first energy to the non-device side of the semiconductor substrate. The second energy source applies the pulse energy to the device side of the substrate. For example, the first energy source may generate a peak energy at a wavelength in a range of about 0.2 microns to 3.0 microns. In addition, the first energy source may comprise one or more tungsten halogen lamps.

According to another aspect, the second energy source generates a peak energy at a wavelength in a range of about 0.2 microns to 0.9 microns. For example, the second energy source may comprise one or more tungsten halogen lamps or one or more xenon lamps. In a further aspect, the apparatus includes a filter, which absorbs energy from the second energy source having a wavelength greater than about 0.7 microns or greater than about 0.9 microns.

It can be appreciated from the foregoing that the present invention provides an improved semiconductor processing apparatus that controls the heating of a semiconductor in a manner to permit growth of very shallow devices on the substrate while limiting diffusion of the reactant gas molecules though the semiconductor substrate. Furthermore, the balance of the heating minimizes the thermoelastic stresses in the substrate.

These and other objects, features, and advantages will become more apparent with a review of the drawings and specification, which follow.

DESCRIPTION OF THE DRAWINGS

FIG. 5 is an enlarged view of the apparatus top cover of FIG. 4;

FIG. 6 is a bottom plan view of the apparatus top cover of FIG. 5; and

FIG. 6A is an enlarged view of one of the lamp supports of FIG. 6.

DETAILED DESCRIPTION OF THE PREFERRED EMBODIMENTS

Figure 1:
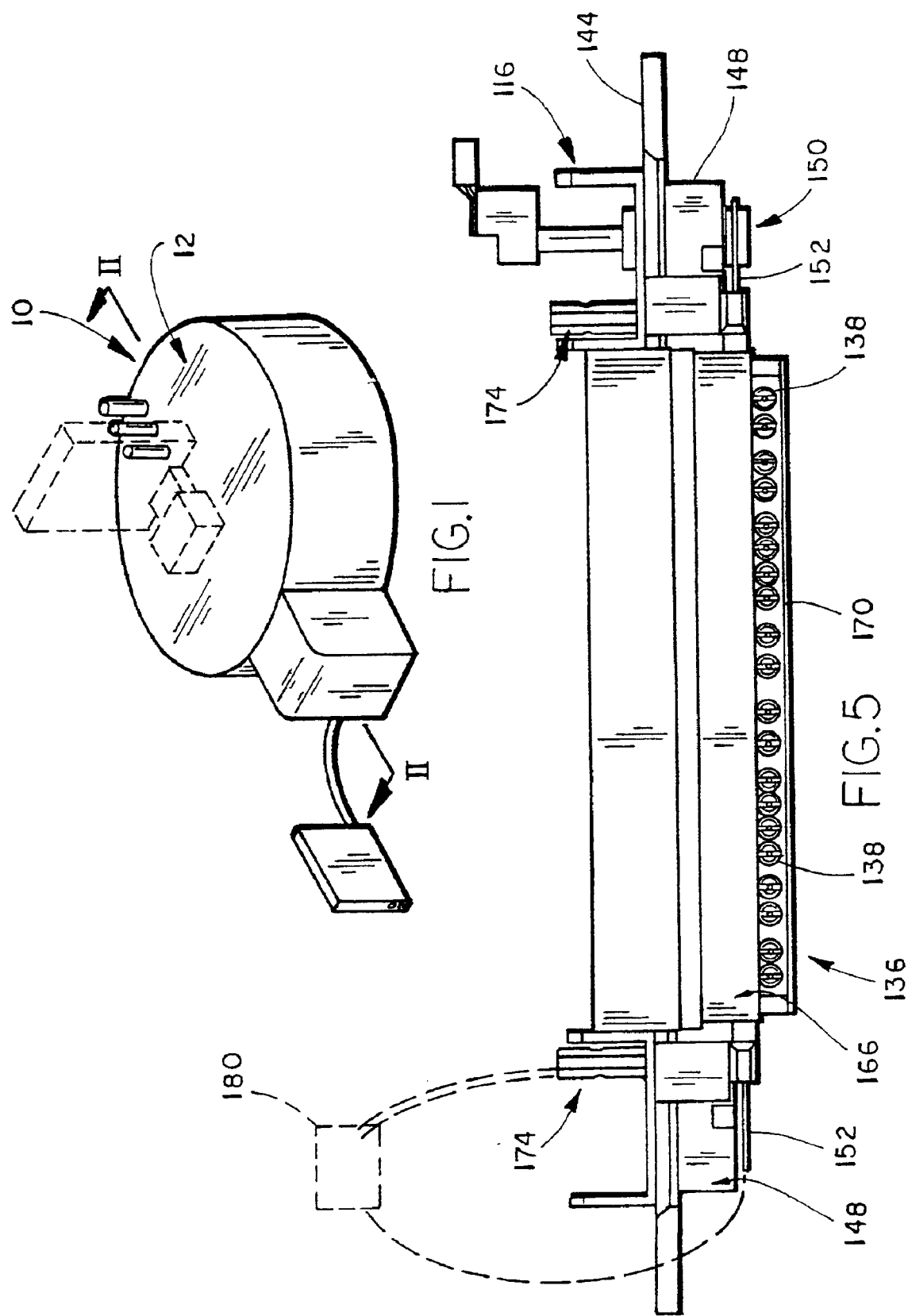
FIG. 1 is a perspective view of a semiconductor processing apparatus of the present invention.

Referring to FIG. 1, the numeral 10 generally designates a semicondector processing apparatus of the present invention. As will be more fully described below, semiconductor processing apparatus 10 is adapted to deliver heat to a semiconductor substrate S, such as a silicon wafers which is supported in a chamber 20 of apparatus 10, in a manner to achieve thinner junctions and, therefore, create faster devices, while maintaining the vertical thermoelastic stresses in the substrate at acceptable levels. Furthermore, apparatus 10 is adapted to heat the device side of the substrate to no more of a depth in a range of about 1 to 5 micro-meters, more preferably in a range of about 1 to 3 micro-meters and, most preferably, to a depth in a range of about 1 to 2 micro-meters, and to heat this thickness to a temperature of at least 900° C., more preferably, of at least 1000° C., and most preferably, up to 1100° C. as rapidly as possible and for a short duration, for example on the order of a few hundred milliseconds or less, while maintaining the vertical thermoelastic stresses in the substrate at acceptable levels.

Figure 2:
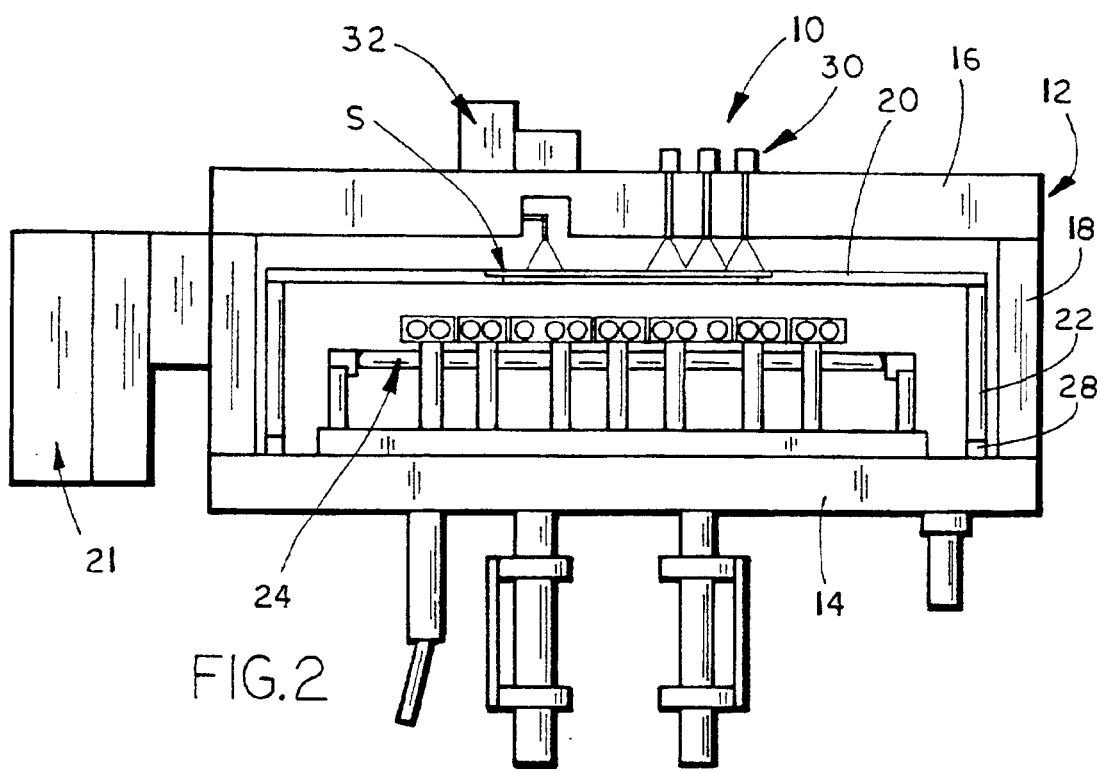
FIG. 2 is a cross section view taken along line II-II of FIG. 1.
Figure 3:
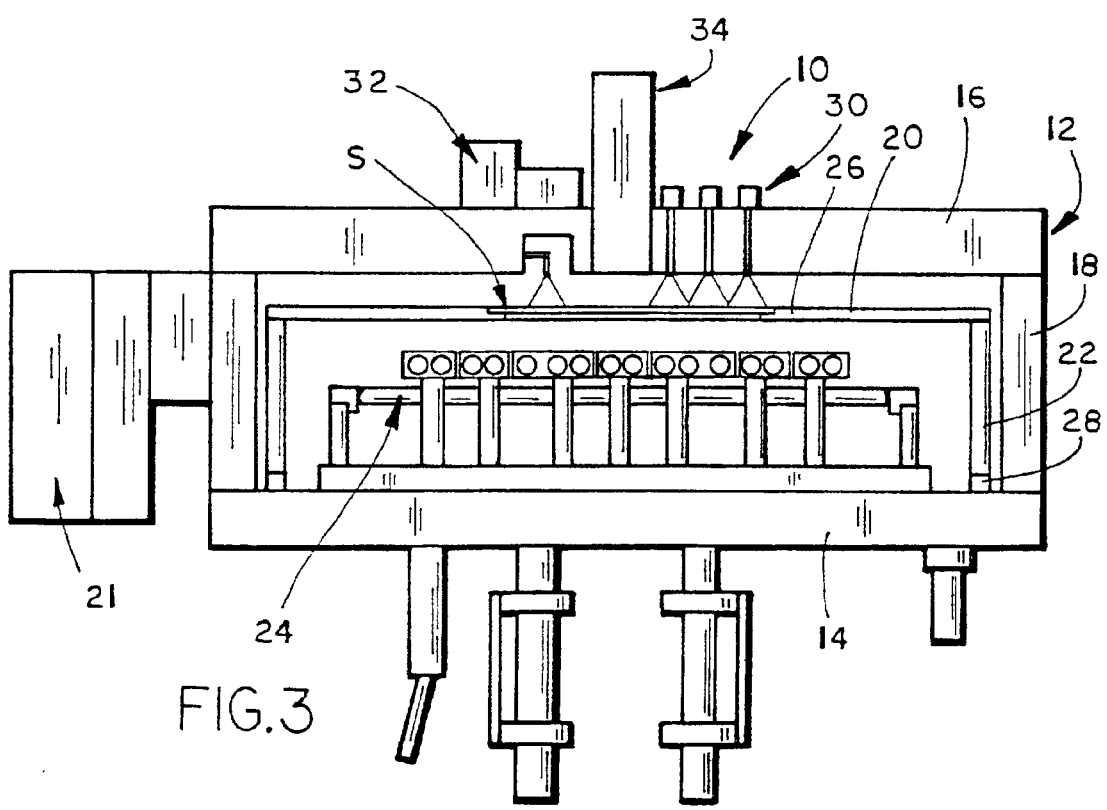
FIG. 3 is a similar view to FIG. 2 illustrating a high intensity energy source mounted in the cover of the apparatus of FIG. 2.

Referring to FIG. 2 and FIG. 3, semiconductor processing apparatus 10 includes a housing 12 in which substrate S is supported for processing. Housing 12 includes a base 14, a cover 16, and a sidewall 18, which together define therebetween processing chamber 20. The chamber walls and cover are typically water cooled to approximately 45–75 degrees Fahrenheit by a conventional recirculating chilled water flow system, which is commonly known in the art. Positioned in housing 12 is a heater housing 22, which houses and encloses a first heating apparatus 24, which is supported on base 14 of housing 12. For details of suitable heating apparatuses, reference is made to U.S. Pat. Nos. 5,951,896; 5,814,365; and 6,310,323, which are incorporated by reference in their entireties herein. Heater housing 22 includes a platform 26 on which substrate S is supported during processing. Preferably, heater housing 22 is rotatably supported in housing 12 and mounted on a rotatable base 28, which is supported on base 14 of housing 12. Heater housing 22 and base 28 are preferably rotated using a conventional magnetically coupled drive mechanism or other suitable driving devices which can impart rotation to housing 22 and base 28 through a vacuum seal. Depending on the specific processing, revolutions per minute of base 28 may be varied and preset, for example, in a range of about 5 to 300 rpm or greater. For further details of a suitable platform, reference is made to U.S. Pat. Nos. 6,090,212; 6,007,635; and, further, to U.S. Pat. application entitled PLATFORM FOR SUPPORTING A SEMICONDUCTOR SUBSTRATE AND METHOD OF SUPPORTING A SUBSTRATE DURING RAPID HIGH TEMPERATURE PROCESSING, Ser. No. 09/419,555, filed Oct. 18, 1999 (Attorney Docket MIC04 P-105), which are herein incorporated by reference in their entireties.

Similar to the reactor described in U.S. Pat. No. 5,814,365, cover 16 includes mounted therein a plurality of optical fiber temperature probes 30, which are used to measure the temperature of the substrate during processing. Furthermore, cover 16 further includes a non-contact emissivity measurement system 32, also similar to the emissivity system described in U.S. Pat. No. 5,814,365, which measures the emissivity and calculates the temperature of substrate S during processing.

As will be more fully described below, semiconductor processing apparatus 10 is adapted to heat the non-device side of substrate S with heating assembly 24 and, further, adapted to heat the device side of substrate S to a temperature greater than the non-device side for a heat activation period, which provides sufficient energy to activate the impurities that have been injected into chamber 20 so that they become part of the lattice structure of the semiconductor substrate. Furthermore, as will be more fully described, heating assembly 24 heats the non-device side of substrate S to a reference temperature, which is less than the activation temperature to reduce the temperature gradient in the substrate to minimize stress in the substrate. In addition, the heat delivered to the device side of substrate S is delivered as a pulse of energy with a duration that may vary from 1 or 2 microseconds up to 1 to 2 seconds, but more typically for about a few hundred milliseconds. Preferably, the high-energy pulse is greater than the substrate band gap. For example, for a silicon substrate, the wavelength of the high-energy pulse is preferably in the range of about 0.3 microns to about 0.9 microns.

Referring again to FIG. 3, supported in cover 16 is a source of high energy 34. In the illustrated embodiment, source 34 comprises one or more xenon lamps, which are positioned above substrate S and direct heat to the device side of substrate S. Xenon lamps typically deliver high energy over wavelengths in a range of about 0.3 microns to about 0.9 microns with a peak energy delivered over a range of about 0.3 microns to 0.7 microns. Preferably, energy source 34 heats the device side of substrate S to a temperature of greater than 900° C., more preferably, to a temperature of greater than 1000° C., and most preferably to a temperature of up to 1100° C. Furthermore, source 34 is adapted to deliver the energy to substrate S over a period of about 1 or 2 microseconds up to 1 or 2 seconds to provide pulse heating of substrate S. In a preferred form, the energy is delivered to substrate S over a period of a few hundred milliseconds. In this manner, energy source 34 heats the device side of substrate S to an activation temperature, which activates the impurities so that they are implanted and become part of the substrate lattice, but because of the short duration of the applied energy, diffusion of the impurities into the substrate is limited.

In contrast, heater assembly 24 heats the non-device side of substrate S to a temperature in a range of approximately 400° C. to about 900° C. and, more preferably, to a temperature in a range of about 500° C. to about 600° C. In addition, preferably non-device side is heated uniformly, for example, with a radial temperature uniformity of ±1° C. While source 34 delivers heat to the device side of substrate S over a frequency range that is totally absorbed by the semiconductor substrate material, such as silicon, heater assembly 24 may deliver heat over a wider range of frequencies, for example from about 0.9 microns to about 3.0 microns, but more typically in a range of 0.9 microns to 2.3 microns. In preferred form, heating assembly 24 includes a plurality of T3 tungsten halogen lamps which are arranged in a plurality of zones, such as described in U.S. Pat. No. 5,951,896. The zones are arranged and, further, controlled in a manner to achieve a substantially uniform temperature across the substrate.

As previously described, heater housing 22 is rotatably supported in housing 12 and, therefore, rotatably supports substrate S in processing chamber 20 whereby substrate S is uniformly heated. Heater housing 22 preferably rotates substrate S at a range of 5 rpm to 60 rpm. However, in some applications, which will be more fully described below, heater housing 22 may rotate substrate S at a range of up to about 200 rpm to 300 rpm. Also as previously described, heating device 34 preferably heats the device side of substrate S with pulse heating. For example, heating device 34 heats device side of substrate S at a pulse in a range of 1 or 2 microseconds up to 1 or 2 seconds, and more typically in a range of a few hundred milliseconds. Where substrate S is supported on a rotational platform that rotates substrate S in a range of about 5 rpm to 60 rpm, heating device 34 preferably heats the device side with multiple pulses.

After a semiconductor wafer is placed in chamber 20 (which is evacuated) through a chamber valve 21 and is placed on platform 26 by a conventional wafer transport device (not shown), such as an automated transport robot, its emissivity is first measured by emissivity measurement system 32 and its temperature is then set to a preset value at a range of about 400° C. to 900° C., more typically in a range of about 500° C. to 600° C. This temperature is chosen to optimize and minimize the thermoelastic stress that may be induced as the device side (top surface as viewed in FIG. 2) of substrate S is irradiated with the high energy generated by source 34. Under steady state conditions, substrate S is rotated in a range of about 5 to 60 rpm, depending on the specific process and typically around 10 rpm with a typical radial temperature uniformity in a range of about ±1°C.

In other applications, the rotation of heater housing 22 is increased to a much higher speeds such as up to a range of 200 to 300 rpm but typically at a speed of 180 rpm over a period of a few seconds. As noted above, substrate S is irradiated with a short pulse of this high energy. The pulse duration is selected depending on the implant impurity in the specific device geometry that is being processed. The pulse duration typically varies from a few microseconds up to 1 to 2 seconds. However, typically a few hundred milliseconds can be used. Since source 34 delivers energy over a wavelength at a range of typically in a range of about 0.3 microns to 0.9 microns, the substrate absorbs substantially all of the energy with practically no transmission. The absorbed energy from source 34 energizes the top layer, such as 1 to 2 microns, of the device side of the substrate and activates the implanted impurities so that they will become part of the lattice of the substrate material. As the pulse duration passes, the absorbed energy then relaxes and results in vertical temperature decay into the bulk silicon temperature field that is at a steady state of approximately 500° to 600°. The bulk of the silicon substrate, therefore, acts as a heat sink which rapidly quenches the high energy induced into the top 1 to 2 micron layer. The result is a controlled implant diffusion into the silicon.

The reactive gas (or gasses), such as boron, arsenic, phosphorous, or the like, is injected into chamber 20 by a gas injection system that delivers gas into chamber through cover 16, such as disclosed in U.S. Pat. No. 5,814,365 or in co-pending U.S. patent applications Ser. No. 09/532,588, filed Mar. 22, 2000, and Ser. No. 09/488,309, filed Jan. 20, 2000, which are incorporated by reference herein in their entireties. Alternately, gas injection into chamber 20 may be achieved through ports in the side of the chamber, with the unreacted gas or exhaust gas exhausted through an exhaust port that is located across the substrate at another side of the chamber. For an example of such as injector/exhaust arrangement, reference is made to U.S. Pat. No. 4,834,022, which is incorporated by reference herein in its entirety.

Optionally and preferably, source 34 includes water-cooled xenon lamps to thereby minimize any black body radiation from the lamps' casings or the like. In addition, processing apparatus 10 may incorporate a filter, such as a quartz filter, which is used to remove the range of emitted wavelengths from energy source 34 that are above the undesired range, typically greater than 0.90 microns and, in some cases, above 0.7 microns. Since quartz transmits energy of wavelengths of less than 1 micron and absorbs energy of wavelengths greater than 1 micron, a quartz filter is particularly suitable for the present application. Optionally, the quartz filter may be water cooled to prevent the heat from the quartz filter, which can act as a black body radiator, further heating the substrate.

It should be understood from the foregoing, the careful optimization of the wafer uniform bulk temperature, which reduces the radial stresses in the substrate and enables the minimization of vertical thermoelastic stresses in the substrate, the top irradiation energy source power, and duration of the energy source power offer the maximum control over the annealing process of the emerging shallow junction device geometries. The use of high rotational speeds prior to the irradiation pulse enables the achievement of a high degree of uniformity of pulse radial distribution as well.

As the geometry of the semiconductor is rapidly shrinking, so is the depth of the activated implanted impurity, namely, the junction depth. As the junction depth becomes very shallow, then the thermal annealing process becomes more challenging since the impurities' thermal diffusion into the silicon has heretofore accompanied the activation process. It can be appreciated, the present invention provides activation of the implanted impurity into the silicon lattice while limiting its diffusion depth into the silicon substrate. Furthermore, the present invention provides an effective annealing process which is directly related to the silicon lattice perfection and the residual defect in the implanted doped layer, which determines the goodness of the electrical activation of the implanted impurities. As a result, the present invention provides a novel semiconductor processes apparatus which anneals implanted impurities to achieve both rapid activation while maintaining maximum control over their diffusion through the semiconductor substrate.

Figure 4:
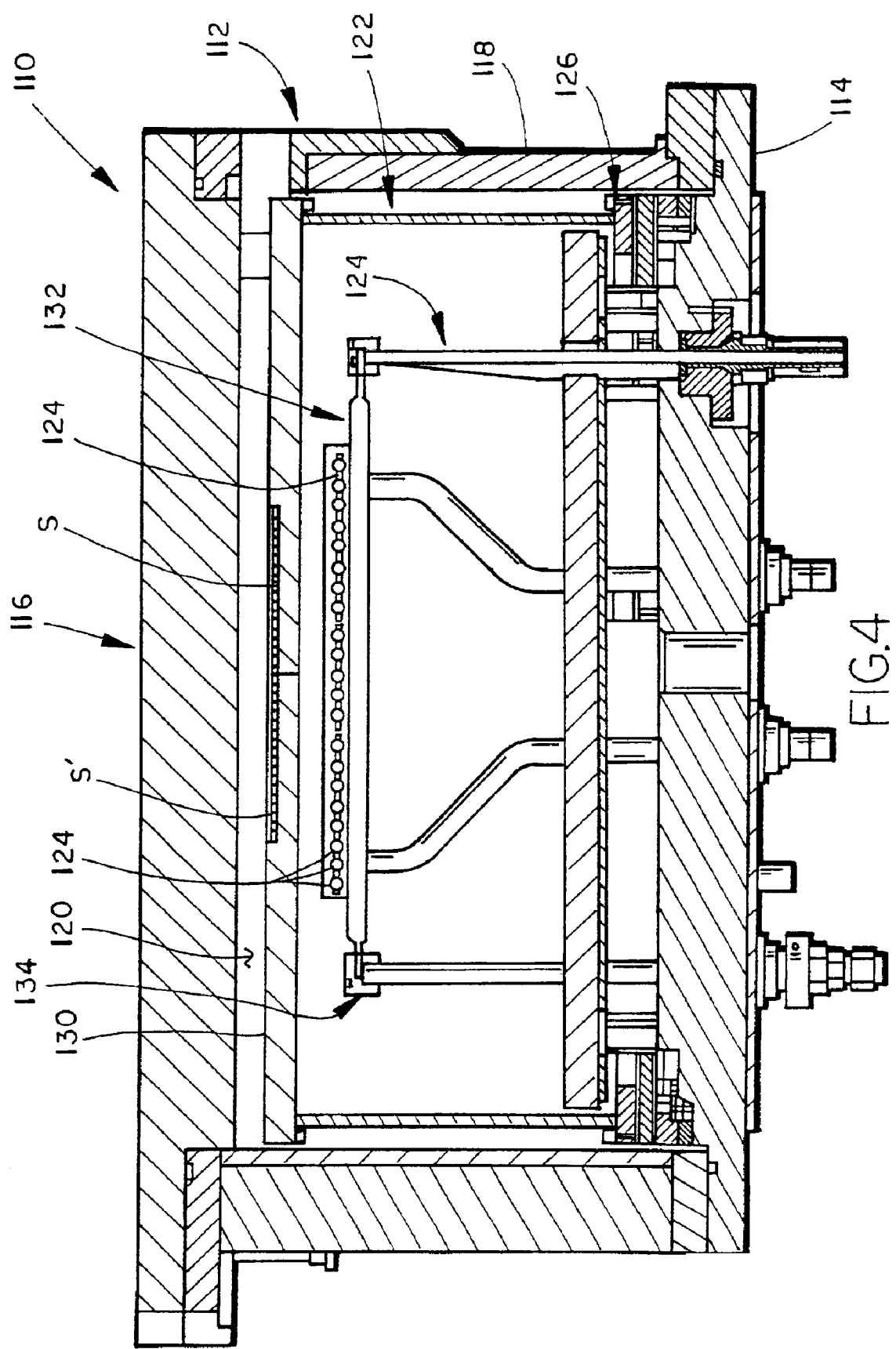
FIG. 4 is a cross section view similar to FIGS. 2 and 3 illustrating another embodiment of the semiconductor processing apparatus of the present invention.

Referring to FIG. 4, the numeral 110 generally designates another embodiment of the semiconductor processing apparatus of the present invention. Processing apparatus 110 includes a housing 112, which includes a base 114, a cover 116, and a sidewall 118, which together define therebetween a processing chamber 120. Positioned in housing 112 is a heater housing 122. Supported in heater housing 122 is a first heater assembly 124, similar to heater assembly 24, which is adapted to heat the non-device side of substrate S, as will be more fully described below. Housing 122 includes a base 126, which is rotatably supported on base 114 of housing 112 and, preferably, driven by a magnetically coupled drive mechanism that rotates housing 122 through a vacuum seal, which are commonly known in the art. Heater housing 122 also includes a platform 130 on which substrate S is supported during processing. Therefore, when housing 122 is driven by the drive mechanism, platform 130 and substrate S are rotated in processing chamber 120. As described in reference to the previous embodiment, the rotation of substrate S may vary depending on the application but typically ranges from about 5 to 60 rpm, and in some cases up to 200 to 300 rpm.

Heater assembly 124 includes a plurality of heating lamps 132, which are arranged in multiple zones to provide uniform heating across substrate S. Optionally, lamps 132 may be supported by water-cooled supports 134 to permit heater assembly 124 to optimize its power output (to enhance the processing of substrate S) while maintaining the temperatures below a maximum threshold level so that heater assembly 124 can operate more efficiently in a reduced pressure environment. In addition, heater assembly 124 heats the non-device side of substrate S to a reference temperature, which is in a range of approximately 400° C. to about 900° C. and, more preferably, to a temperature in a range of about 500° C. to about 600° C. In addition, preferably non-device side is heated uniformly, for example, with a radial temperature uniformity of about ±1° C. Lamps 132 preferably generate a peak energy at wavelength over a range of frequencies, for example, from about 0.9 microns to 3.0 microns, but more typically in a range of 0.9 microns to 2.3 microns. In preferred form, heating assembly 124 includes a plurality of T3 tungsten halogen lamps that are arranged in a plurality of zones, such as described in U.S. Pat. No. 5,951,896. The zones are arranged and, further, controlled in a manner to achieve a substantially uniform temperature across the substrate. For further details of suitable heater assemblies, reference is also made to U.S. Pat. No. 6,310,323, which is incorporated by reference in its entirety herein.

Similar to the previous embodiment, cover 116 supports one or more temperature probes 131 (FIG. 5) and a source of energy 136 for heating device side S' of substrate S. Similar to energy source 34, energy source 136 preferably heats the device side of substrate S to a heat activation temperature of greater than 900° C., more preferably, to a temperature of greater than 1000° C., and most preferably to a temperature of up to 1100° C. Referring to FIG. 5, energy source 136 comprises a plurality of heating lamps 138, which are arranged in multiple zones to provide uniform heating across substrate S. As best seen in FIG. 6, lamps 138 are arranged with a first group of lamps extending along or parallel to a first axis 140 to form a first tier and a second group of lamps extending along or parallel to a second axis 142 to form a second tier. As will be more fully described below, lamps 138 are further arranged in zones within each tier of lamps to permit optional control of the energy delivered to substrate S.

Lamps 138 are mounted in cover 116 by a support frame 144, which includes a base 146. Mounted to base 146 are a plurality of transverse support members 148. Secured to transverse support members 148 are a plurality of lamp supports 150, which support the respective electrodes 152 of the respective lamps 138. Referring to FIG. 6A, each lamp support 150 includes a base 154, which preferably comprises a body formed from a conductive material, such as nickel-plated copper, or the like, which forms a contact for the respective heater support. Optionally, base 154 may include a plurality of recesses (not shown), which form sockets for receiving the respective electrodes 152 of lamps 138. Each lamp support 150 further includes a non-conductive bracket 160 which is secured to base 154 by fasteners 162 which urge electrodes 152 into contact with base 154 to ensure a good electrical connection. Base 154 is coupled to an electrical conduit, such as a wire 164, for delivering current to the respective lamps, as will be more fully described below. It should be understood that each lamp support 150 may support one or more lamps. In addition, supports 150 may comprise cooled lamp supports, such as described in U.S. Pat. No. 6,310,323.

As best seen in FIGS. 5 and 6, cover 116 preferably includes a reflector 166, which is positioned behind lamps 138 to direct energy from lamps 138 towards substrate S. Reflector 166 is made from a high reflective material such as gold, nickel, chrome or the like. Optionally, reflector 166 may be formed on the side of cover 116 facing substrate S with the side of the cover 116 polished and plated with the highly reflective material. Suitable lamps may include the lamps described in U.S. Pat. No. 5,951,896, which incorporate reflectors into the lamp structure; thus, potentially eliminating the need for a reflector. However, it should be understood that reflector 166 would provide added efficiency since the overlapping arrangement of the lamps can result in energy reflected back toward cover 116.

Lamps 138 preferably emit energy in a spectrum that spans a wavelength in a range of about 0.2 microns to several microns and, most preferably, in a range of about 0.2 to 3 microns. However, since energy having wavelengths above 1 micron are mostly heating wavelengths, and are undesirable in the present application, heating assembly 136 preferably includes a filter 170, which filters energy of wavelengths above about 1 micron. A suitable material for filter 170 includes, for example, a quartz plate, which transmits energy having a wavelength below 1 micron but absorbs energy having wavelengths above 1 micron. A suitable plate thickness for quartz is in a range of about 1 mm to 5 mm and, more preferably, about 3 mm. Optionally and preferably, filter 170 is cooled to thereby minimize the black body radiation from filter 170 to substrate S. For example, filter 170 may comprise two parallel quartz plates that are, as note above, transparent at the frequencies desired for heating substrate S, and are spaced apart to define a cavity there between through which cooling fluid is passed to cool the quartz plates.

Lamps 138 preferably comprise tungsten halogen lamps and are arranged in two or more tiers, with one group of lamps aligned along one axis in one of the tiers and another group of lamps aligned along another axis, which is generally orthogonal to the first axis, in the second tier. In addition, the lamps are group or are arranged in a multi-zone array within each tier, similar to the heater assembly described in U.S. Pat. Nos. 5,951,896 or 5,059,770, which are incorporated by reference herein in their entireties. As noted above, lamps 138 emit energy in a spectrum that spans a wavelength in a range from about 0.2 microns to several microns, with most of the energy emitted between 0.2 and 2.3 microns. Lamps 138 are typically operated at 208 volts AC. Full continuous lamp power output from lamps 138 is achieved when a normal operating voltage of 208 VAC is applied to the lamps. At this voltage, lamps 138 can be operated up to several thousand hours. As noted below, lamps 138 supply power through a solid state relay 184, which is controlled by a digital timer 182. In this case, the time is set, for example, in a range of a few microseconds to several seconds, more typically, in a range of 100 milliseconds to 400 millisecond, and, more typically, for about 300 milliseconds. After the time is set then the full (208 VAC) power is delivered to lamps 138 when the timer is turned on, which as described below, is typically and preferably controlled by a computer with appropriate controlling software and is turned off after, for example, the 300 millisecond pulse period. In the present application, a voltage of 480 VAC is preferably applied to lamps 138 to transform lamps 138 in to a short pulse high-energy lamp output for a very short controlled period of time. It has been found that lamps 138 can be operated under these conditions over periods ranging from a few milliseconds to 3000 milliseconds. It also has been found that the sudden rush or current due to such a high voltage or biasing application on to lamps 138 causes the output energy spectrum to shift significantly to the shorter wavelengths, and mostly below 1 micron and, for example, between about 0.2 microns and 0.9 microns. Therefore, this novel use of standard tungsten halogen lamps generates a xenon light effect energy spectrum with a much higher power output at shorter wavelengths and with a much lower cost. Furthermore, when lamps 138 are arranged in multi-zones, as described above, different timers can be used to trigger selected groups of lamps for different durations, with such duration variations used to adjust for achieving wafer implant activation within very short average pulses.

Optionally and preferably, heating assembly 136 is movably supported in cover 116 so that heating lamps 138 may be moved toward or away from substrate S to vary the energy delivered to substrate S. For example, frame 144, such as transverse supports 148, are mounted to one or more linear drivers 174 (which are commonly known in the art), which lower or raise heating assembly 136 within chamber 120. Drivers 174 are similar to magnetically driven linear drivers used to raise or lower substrate S off platform 130 (such as described in U.S. Pat. No. 5,814,365).

Drivers 174 along with lamps 138 are controlled by a central processor 180, which adjusts the position of heating assembly 136 and/or the activation of lamps 138 to produce a controlled pulsed high-energy output. In addition, central processor 180 may control which lamps or groups of lamps are actuated. For example, referring to FIG. 6, a group of lamps, such as lamps 138a, may be grouped as one zone, with the respective contacts of the heater supports of lamps 138a coupled to central processor 180 via a trigger circuit 180. Trigger circuit 180 preferably includes contact timer 182 and solid-state relay 184, which controls the duration of the energy pulse delivered to substrate S from the respective lamps (138a). It should be understood that each zone may have different trigger circuits with different timers, with such duration variations used to adjust the energy delivered to substrate S and to achieve wafer implant activation within very short pulses of energy.

Similar to the previous embodiments, a reactant gas or gasses is injected into chamber 120 to one or more ports, which may be located in cover 116 or may be located to the side of housing 112. For examples of suitable injection systems gas injection and exhaust systems, reference is made herein to U.S. Pat. Nos. 5,814,365, and 4,834,022, and co-pending U.S. patent applications Ser. No. 09/532,588, filed Mar. 22, 2000 and Ser. No. 09/488,309, filed Jan. 20, 2000.

It can be appreciated from the foregoing that the present invention provides an improved semiconductor processing apparatus that includes a device side heater and a non-device side heater that applies energy to the semiconductor substrate in a manner to permit controlled implantation of reactant molecules in the lattice of the substrate to growth of very shallow devices on the substrate while limiting diffusion of the reactant gas molecules though the semiconductor substrate. In addition, by balancing the heating of the two sides of the substrate, the thermoelastic stresses in the substrate are minimized.

While several forms of the invention have been shown and described, other forms will now be apparent to those skilled in the art. Therefore, it will be understood that the embodiments shown in the drawings and described above are merely for illustrative purposes, and are not intended to limit the scope of the invention, which is defined by the claims, which follow.

I claim:

1. A semiconductor processing apparatus comprising:
   a processing chamber adapted to support a semiconductor substrate therein;
   a first energy source adapted for applying a first energy to a non-device side of the semiconductor substrate to heat the non-device side of the substrate to a reference temperature;
   a second energy source adapted for applying a second energy to a device side of the semiconductor substrate to heat the device side to a heat activation temperature, said second energy source applying said second energy for an activation period sufficient to activate impurities in the substrate so that they become part of the lattice structure of the substrate while minimizing diffusion of the impurities across the substrate, end said reference temperature being less than said heat activation temperature to reduce the temperature gradient in the substrate to minimize stress in the substrate; and
   a filter, said filter absorbing energy from said second energy source having a wavelength greater than about 0.9 microns.

2. The semiconductor processing apparatus according to claim 1, said filter absorbing energy from said second energy source having a wavelength greater than about 0.7 microns.

3. The semiconductor processing apparatus according to claim 1, wherein said filter comprises a fluid cooled filter.

* * * * *

UNITED STATES PATENT AND TRADEMARK OFFICE
CERTIFICATE OF CORRECTION

PATENT NO. : 6,965,092 B2 Page 1 of 1
APPLICATION NO. : 10/074287
DATED : November 15, 2005
INVENTOR(S) : Imad Mahawili It is certified that error appears in the above-identified patent and that said Letters Patent is hereby corrected as shown below:

Column 4:
Line 40, "semicondector" should be --semiconductor--.
Line 43, "wafers" should be --wafer,--.

Column 6:
Line 60, "speeds" should be --speed,--.

Column 12:
Line 16, Claim 1, "end" should be --and--.

Signed and Sealed this

Ninth Day of January, 2007

JON W. DUDAS
*Director of the United States Patent and Trademark Office*